US009164152B2

(12) United States Patent
Chiang

(10) Patent No.: US 9,164,152 B2
(45) Date of Patent: Oct. 20, 2015

(54) ULTRA LOW STARTUP CURRENT POWER DETECTION APPARATUS

(75) Inventor: Yun-Chi Chiang, Hsinchu County (TW)

(73) Assignee: Power Forest Technology Corporation, Hsinchu County (TW)

( * ) Notice: Subject to any disclaimer, the term of this patent is extended or adjusted under 35 U.S.C. 154(b) by 508 days.

(21) Appl. No.: 13/558,364

(22) Filed: Jul. 26, 2012

(65) Prior Publication Data

US 2013/0285674 A1   Oct. 31, 2013

(30) Foreign Application Priority Data

Apr. 27, 2012   (TW) ............................. 101115229 A

(51) Int. Cl.
*H03K 17/22*   (2006.01)
*G01R 31/40*   (2014.01)
*G01R 19/165*   (2006.01)

(52) U.S. Cl.
CPC .......... *G01R 31/40* (2013.01); *G01R 19/16519* (2013.01)

(58) Field of Classification Search
CPC ... H03F 3/3022; H03F 3/45475; H03F 3/156; H03F 3/158; H03F 3/012; H03F 3/013
USPC .......... 330/263, 264, 255; 324/609, 771, 124, 324/97, 519
See application file for complete search history.

(56) References Cited

U.S. PATENT DOCUMENTS

| 4,309,627 | A | * | 1/1982 | Tabata | 327/81 |
| 5,654,629 | A | * | 8/1997 | Theus | 323/316 |
| 6,472,912 | B1 | * | 10/2002 | Chiu et al. | 327/143 |
| 2009/0001958 | A1 | * | 1/2009 | Fujii | 323/313 |
| 2010/0289529 | A1 | * | 11/2010 | Kao et al. | 327/50 |

FOREIGN PATENT DOCUMENTS

| CN | 101236218 | 8/2008 |
| JP | 2011259250 | 12/2011 |
| TW | 200916796 | 4/2009 |
| TW | 201039326 | 11/2010 |
| TW | 201142858 | 12/2011 |

OTHER PUBLICATIONS

"Office Action of Taiwan Counterpart Application", issued on Apr. 1, 2014, p. 1-p. 9.
"Office Action of China Counterpart Application," issued on Feb. 25, 2015, p. 1-p. 6.

* cited by examiner

*Primary Examiner* — Patrick Assouad
*Assistant Examiner* — Taqi Nasir
(74) *Attorney, Agent, or Firm* — Jianq Chyun IP Office

(57) ABSTRACT

A power detection apparatus is provided. The power detection apparatus includes a first current processing circuit and a second current processing circuit. The first current processing circuit is configured to provide a dynamic bias voltage at a bias terminal in response to a variation of a system power. The second current processing circuit is coupled to the first current processing circuit and is biased under the dynamic bias voltage for outputting a power good signal at an output terminal to represent that the system power is ready when the dynamic bias voltage is greater than a threshold voltage.

14 Claims, 3 Drawing Sheets

ULTRA LOW STARTUP CURRENT POWER DETECTION APPARATUS

CROSS-REFERENCE TO RELATED APPLICATION

This application claims the priority benefit of Taiwan application serial no. 101115229, filed on Apr. 27, 2012. The entirety of the above-mentioned patent application is hereby incorporated by reference herein and made a part of this specification.

BACKGROUND

1. Technical Field

The invention relates to a power detection technique, and particularly, to an ultra low startup current power detection apparatus which is configured to detect whether the power is ready.

2. Description of Related Art

In the modern day, electronic apparatus systems have a detection circuit to generate a signal if the system power is not ready (such as the voltage level of the system power is lower than a certain predetermined voltage value). The signal generated by the detection circuit will force the system to stop normal operations. After the power supplied to the system is ready (i.e. the voltage level of the system power is higher than the predetermined voltage value), the signal generated by the detection circuit will change it status to make the system to start operation. In some application, when the provided power level of the system is lower than the predetermined voltage value, the power consumption of the system should be as low as possible. Under such condition, other circuits of the system may be disabled in response to the signal generated by the detection circuit. Therefore, how to design a system power detection circuit with low power consumption is an important issue to be developed by related practitioner.

SUMMARY

Accordingly, an exemplary embodiment of the invention provides a power detection apparatus including a first current processing circuit and a second current processing circuit. The first current processing circuit is configured to provide a dynamic bias voltage at a bias terminal in response to a variation of a system power. The second current processing circuit is coupled to the first current processing circuit, and is biased under the dynamic bias voltage. The second current processing circuit is configured to output a power good signal at an output terminal to represent that the system power is ready when the dynamic bias voltage is greater than a threshold voltage.

According to an exemplary embodiment of the invention, the first current processing circuit is further configured to mirror a current of the bias terminal by a predetermined ratio to the output terminal.

According to a first exemplary embodiment of the invention, the first current processing circuit includes a first transistor, a second transistor, and a first resistor. A source and a body of the first transistor are coupled to the system power. A source and a body of the second transistor are coupled to the system power, and a gate and a drain of the second transistor are coupled to a gate of the first transistor. A first terminal of the first resistor is coupled to the drain of the second transistor, and a second terminal of the first resistor is coupled to the bias terminal to provide the dynamic bias voltage. In this case, the second current processing circuit includes a third transistor, a fourth transistor, and a second resistor. A drain of the third transistor is coupled to the drain of the first transistor and the output terminal to output the power good signal, and a source and a body of the third transistor are coupled to a system ground. A gate and a drain of the fourth transistor are coupled to a gate of the third transistor, the second terminal of the first resistor and the bias terminal. A first terminal of the second resistor is coupled a source of the fourth transistor, and a second terminal of the second resistor is coupled to the system ground. Furthermore, a body of the fourth transistor may be coupled to the first terminal of the second resistor or to the system ground directly.

According to a second exemplary embodiment of the invention, the first current processing circuit includes the first transistor, the second transistor, and the first resistor. A source and a body of the first transistor are coupled to a system ground. A source and a body of the second transistor are coupled to the system ground, and a gate and a drain of the second transistor are coupled to a gate of the first transistor. A first terminal of the first resistor is coupled to the drain of the second transistor, and a second terminal of the first resistor is coupled to the bias terminal to provide the dynamic bias voltage. In this case, the second current processing circuit includes a third transistor, a fourth transistor, and a second resistor. A drain of the third transistor is coupled to the drain of the first transistor and the output terminal to output the power good signal, and a source and a body of the third transistor are coupled to the system power. A gate and a drain of the fourth transistor are coupled to a gate of the third transistor, the second terminal of the first resistor and the bias terminal. A first terminal of the second resistor is coupled the source of the fourth transistor, and a second end of the second resistor is coupled to the system power. Furthermore, a body of the fourth transistor may be coupled to the first terminal of the second resistor or to the system power directly.

According to an exemplary embodiment of the invention, a relationship between current and bias voltage of the second current processing circuit in output terminal is corresponding to a first current-voltage (I-V) curve; a relationship between current and bias voltage of the first current processing circuit in output terminal which is mirrored by the first current processing circuit from its bias terminal is corresponding to a second I-V curve which is different from the first I-V curve; and the first I-V curve and the second I-V curve have an intersection point, and a voltage corresponding to the intersection point is the threshold voltage.

According to an exemplary embodiment of the invention, a size of the first transistor may represent as (W1/L1), where W1 is a width of the first transistor and L1 is a length of the first transistor. A size of the second transistor may represent as (W2/L2), where W2 is a width of the second transistor and L2 is a length of the second transistor. A size of the third transistor may represent as (W3/L3), where W3 is a width of the third transistor and L3 is a length of the third transistor. A size of the fourth transistor may represent as (W4/L4), where W4 is a width of the fourth transistor and L4 is a length of the fourth transistor. [(W3/L3)/(W1/L1)]<[(W4/L4)/(W2/L2)].

According to an exemplary embodiment of the invention, the threshold voltage varies with a resistance of the first resistor, such that the threshold voltage is changed by setting the resistance of the first resistor.

According to an exemplary embodiment of the invention, an operation current of the power detection apparatus varies with a resistance of the second resistor.

According to the first exemplary embodiment of the invention, when the dynamic bias voltage is greater than the threshold voltage, the current of the second current processing circuit output terminal is greater than that the first current processing circuit output terminal. In this case, the power detection apparatus outputs the power good signal with low voltage level at the output terminal.

According to the first exemplary embodiment of the invention, when the dynamic bias voltage is less than the threshold voltage, the current of the second current processing circuit output terminal is less than that of the first current processing circuit output terminal. In this case, the power detection apparatus outputs the power good signal with high voltage level at the output terminal.

According to the first exemplary embodiment of the invention, the first transistor and the second transistor may be P-type transistors, and the third transistor and the fourth transistor may be N-type transistors.

According to the second exemplary embodiment, the first transistor and the second transistor may be N-type transistors, and the third transistor and the fourth transistor may be P-type transistors.

From the above, the power detection apparatus provided by the invention may detect whether any power is ready under an ultra low current (i.e. whether a power is higher than a predetermined voltage value). Therefore, if the power detection apparatus provided by the invention is applied to an electronic apparatus system, and when the system power supplied to the electronic apparatus system, the power good signal is outputted to inform the electronic apparatus system to start operation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
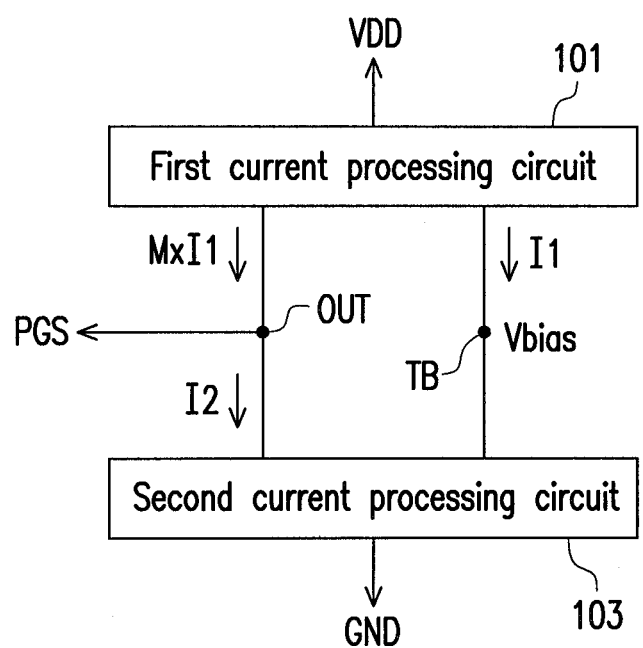
FIG. 1A is a diagram of a power detection apparatus according to a first exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
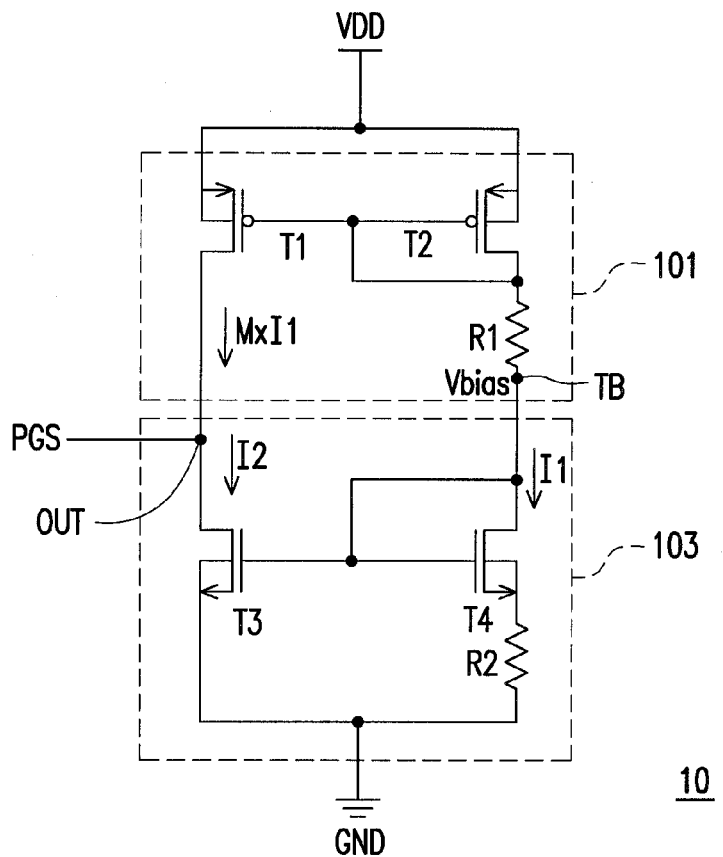
FIG. 1B is an implementation diagram of the power detection apparatus of FIG. 1A.

FIG. 1A is a diagram of a power detection apparatus 10 according to a first exemplary embodiment of the invention, and FIG. 1B is an implementation diagram of the power detection apparatus 10 of FIG. 1A. Referring to FIGS. 1A and 1B, the power detection apparatus 10 has a characteristic of ultra low startup current, and includes a first current processing circuit 101 and a second current processing circuit 103. In the present embodiment, the first current processing circuit 101 is configured to provide a dynamic bias voltage Vbias at a bias terminal TB in response to a variation of a system power VDD.

In detail, the first current processing circuit 101 is configured to mirror a current (I1) of the bias terminal TB by a predetermined ratio (e.g. 1:M, where M is natural number, but not limited thereto) to an output terminal OUT. In this case, the first current processing circuit 101 includes a first transistor T1, a second transistor T2, and a first resistor R1. A source and a body of the first transistor T1 are coupled to the system power VDD. A source and a body of the second transistor T2 are coupled to the system power VDD, and a gate and a drain of the second transistor T2 are coupled to a gate of the first transistor T1. A first terminal of the first resistor R1 is coupled to the drain of the second transistor T2, and a second terminal of the first resistor R1 is coupled to the bais terminal TB to provide the dynamic bias voltage Vbias. In the present embodiment, the first transistor T1 and the second transistor T2 may be implemented by P-type transistors, for example, PMOS transistors, but not limited thereto.

The "variation of the system power VDD" previously mentioned means that the system power VDD is in a rising phase from a system ground GND to the predetermined highest voltage level. Moreover, it is clearly seen from the circuit configuration of the first current processing circuit 101 that the dynamic bias voltage Vbias increases as the system power VDD increases.

On the other hand, the second current processing circuit 103 is coupled to the first current processing circuit 101 and biased under the dynamic bias voltage Vbias provided by the first current processing circuit 103. In the present embodiment, when the dynamic bias voltage Vbias is greater than a threshold voltage VTH (details are described below), the second current processing circuit 103 is configured to output a power good signal PGS to represent that the system power VDD is ready.

In detail, the second current processing circuit 103 includes a third transistor T3, a fourth transistor T4, and a second resistor R2. A drain of the third transistor T3 is coupled to a drain of the first transistor T1 and the output terminal OUT to output the power good signal PGS, and a source and a body of the third transistor T3 are coupled to the system ground GND. A gate and a drain of the fourth transistor T4 are coupled to a gate of the third transistor T3, the second terminal of the first resistor R1, and the bias terminal TB. A first terminal of the second resistor R2 is coupled to a source and a body of the fourth transistor T4, and a second terminal of the second resistor R2 is coupled to the system ground GND. In the present embodiment, the third transistor T3 and the fourth transistor T4 may be implemented by the N-type transistors, for example, NMOS transistors, but not limited thereto. Furthermore, the body of the fourth transistor T4 may be changed to directly couple with the system ground GND.

Herein, if the sizes of the first to the fourth transistors T1 to T4 are represent as (W1/L1), (W2/L2), (W3/L3), and (W4/L4) respectively, so the implementation requirement in the present embodiment should be comply with the following condition 1:

$$[(W3/L3)/(W1/L1)] < [(W4/L4)/(W2/L2)] \qquad 1$$

W1 to W4 are the widths of the first to fourth transistors T1 to T4 respectively, and L1 to L4 are the lengths of the first to fourth transistors T1 to T4 respectively.

Figure 2:
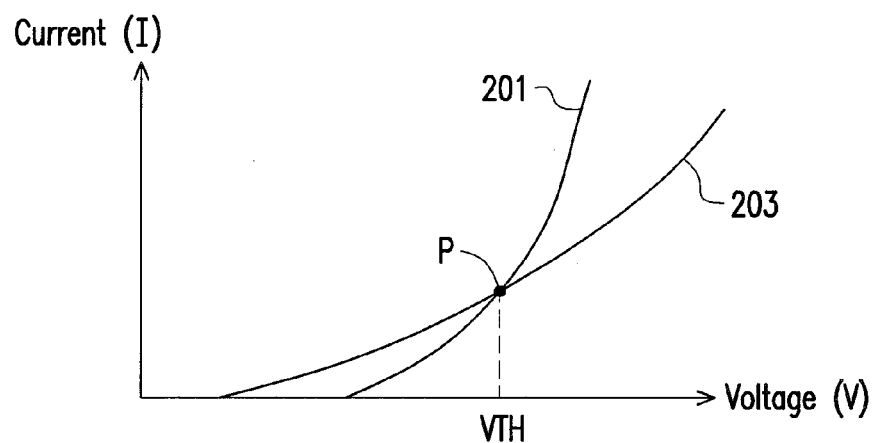
FIG. 2 is a diagram of two current-voltage curves (I-V curves) corresponding to two currents respectively from a first current processing circuit and a second current processing circuit to an output terminal according to an exemplary embodiment of the invention.

Furthermore, as shown in FIG. 2, a relationship between current and bias voltage of the second current processing circuit 103 in output terminal (OUT) is corresponding to a first current-voltage (I-V) curve 201; a relationship between current and bias voltage of the first current processing circuit 101 in output terminal (OUT) which is mirrored by the first current processing circuit 101 from its bias terminal (TB) is corresponding to a second I-V curve 203 which is different from the first I-V curve 201.

It is clearly seen from FIG. 2 that the first I-V curve 201 and the second I-V curve 203 have an intersection point P, and a voltage corresponding to the intersection point P is the aforementioned threshold voltage VTH. In the present embodiment, when the dynamic bias voltage Vbias is greater than the threshold voltage VTH, the current (I2) of the second current processing circuit 103 output terminal (OUT) is greater than that of the first current processing circuit 101 output terminal (OUT) (i.e. the current (M*I1). On the contrary, when the dynamic bias voltage Vbias is less than the threshold voltage VTH, the current (I2) of the second current processing circuit 103 output terminal (OUT) is less than that of the first current processing circuit 101 output terminal (OUT) (i.e. the current (M*I1)).

Base on two I-V curves corresponding to two currents (M*I1, I2) respectively from the first current processing circuit 101 and the second current processing circuit 103 to the output terminal OUT are shown as in FIG. 2, so the currents (M*I1, I2) may vary with the system power VDD. To be specific, the magnitude of the currents M*I1 and I2 interchanges as the system power VDD becomes greater than the threshold voltage VTH.

When the dynamic bias voltage Vbias is not greater than the threshold voltage VTH in response to the rising of the system voltage VDD, the current I1 (if M=1) is greater than the current I2 (I1>I2). In addition, the first processing circuit 101 mirrors the current I1 of the drain of the fourth transistor T4 to the output terminal OUT to compare with the current I2 of the drain of the third transistor T3. Therefore, under the condition where I1>I2, the power detection apparatus 10 outputs a logic "1" to represent that the system voltage VDD is not ready (It is also referred to a power failure signal (PFS)).

On the contrary, when the dynamic bias voltage Vbias is greater than the threshold voltage VTH in response to the rising of the system power VDD, the current I1 (if M=1) becomes less than the current I2 (I1<I2). Similarly, the first current processing circuit 101 mirrors the current I1 of the drain of the fourth transistor T4 to the output terminal OUT to compare with the current I2 of the drain of the third transistor T3. Therefore, under the condition where I1<I2, the power detection apparatus 10 outputs a logic "0" to represent that the system voltage VDD is ready (it is referred to as the power good signal (PGS)).

It is known that if the power detection apparatus 10 is to be applied in the electronic apparatus system, and the power good signal PGS (i.e. logic "0") is outputted by the power detection apparatus 10 to inform the electronic apparatus system to start operation when the system power VDD supplied to the electronic apparatus system is ready. On the other hand, when the system power VDD supplied to the electronic apparatus system is not ready, the power failure signal PFS (i.e. logic "1") is outputted by the power detection apparatus 10 to inform the electronic apparatus system to stop normal operation.

Furthermore, it should be noted that the threshold voltage VTH may vary with the resistance of the first resistor R1. For example, when the resistance of the first resistor R1 increases, the threshold voltage VTH increases. On the contrary, when the resistance of the first resistor R1 decreases, the threshold voltage VTH decreases. Accordingly, if the resistance of the first resistor R1 is adjusted appropriately, the power detection apparatus 10 may be applied to electronic apparatus systems that have different under voltage lockout (UVLO) voltage levels. Furthermore, the first resistor R1 may be consist of a general resistive element or a combination of series-connected diodes or transistors by depending on the actual design, so as to set the desired threshold voltage of detection. In other words, the desired threshold voltage of detection may be changed by setting the resistance of the first resistor R1.

Moreover, an operation current of the power detection apparatus 10 varies with the resistance of the second resistor R2. For example, when the resistance of the second resistor R2 increases, the operation current of the power detection apparatus 10 decreases. Accordingly, if the resistance of the second resistor R2 is adjusted appropriately, the overall power consumption of the power detection apparatus 10 may be decreased effectively. In other words, if the resistance of the second resistor R2 is adjusted appropriately, the power detection apparatus 10 is able to have the characteristic of ultra low start up current.

Figure 3A:
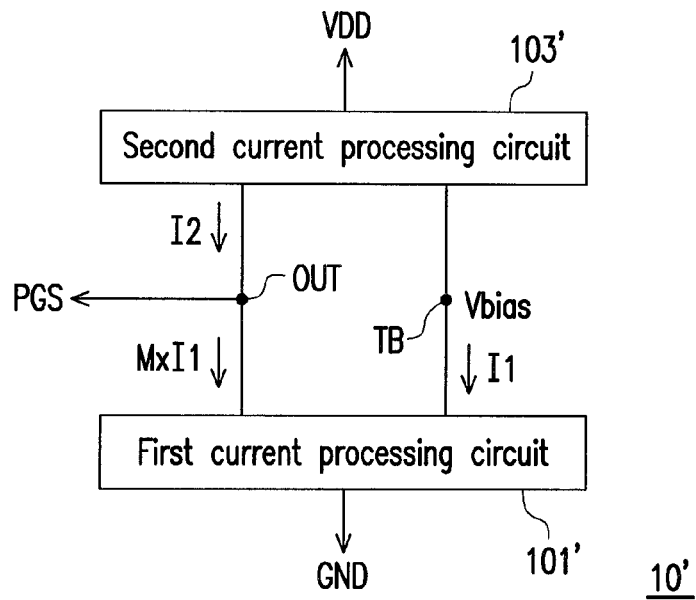
FIG. 3A is a diagram of a power detection apparatus according to a second exemplary embodiment of the invention.
Figure 3B:
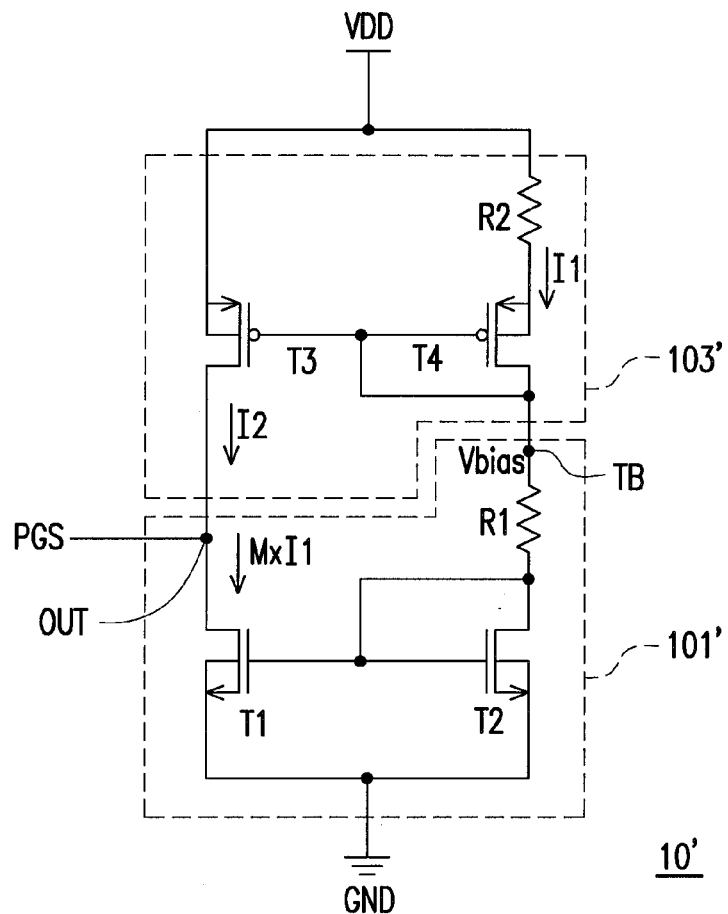
FIG. 3B is an implementation diagram of the power detection apparatus of FIG. 3A.

In addition, FIG. 3A is a diagram of a power detection apparatus 10' according to a second exemplary embodiment of the invention, and FIG. 3B is an implementation diagram of the power detection apparatus 10' of FIG. 3A. Referring to FIGS. 1A, 1B, 3A and FIG. 3B, the circuit configuration of the power detection apparatus 10' and the power detection apparatus 10 are complementary. Namely, the transistors (T1, T2) of the first current processing circuit 101' of the FIG. 3B are modified and implemented by the N-type transistors (i.e. NMOS transistor), and the transistors (T3, T4) of the second current processing circuit 103' are changed and implemented by the P-type transistors (i.e. PMOS transistor). The operation method of the power detection apparatus 10' is similar to the power detection apparatus 10, therefore, the operation and principle of the power detection apparatus 10' are not repeated here.

It should be noted that the logic level of the outputted power good signal PGS by the power detection apparatus 10/10' may be modified according to the requirement of the actual design, and so the aforementioned descriptions do not give indications to limit the scope of the invention.

In summary, the power detection apparatus provided by the invention may detect whether any power is ready under an ultra low current (i.e. whether a power is higher than a predetermined voltage value). Therefore, if the power detection apparatus provided by the invention is applied to an electronic apparatus system, and when the system power supplied to the electronic apparatus system, the power good signal is outputted to inform the electronic apparatus system to start operation.

Although the present invention has been described with reference to the above embodiments, however, the present invention is not limited thereto. It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A power detection apparatus, comprising:
a first current processing circuit, wherein the first current processing circuit is configured to provide a dynamic bias voltage at a bias terminal in response to a variation of a system power; and a second current processing circuit, coupled in cascade with the first current processing circuit and biased under the dynamic bias voltage, wherein the second current processing circuit is configured to output a power good signal at an output terminal to represent that the system power is ready when the dynamic bias voltage is greater than a threshold voltage, wherein the first current processing circuit comprises:
　a first transistor, having a source and a body both coupled to the system power;
　a second transistor, having a source and a body both coupled to the system power, and a gate and a drain both coupled to a gate of the first transistor; and
　a first resistor, having a first terminal coupled to the drain of the second transistor, and a second terminal coupled to the bias terminal to provide the dynamic bias voltage, wherein the second current processing circuit comprises:
　a third transistor, having a drain coupled to a drain of the first transistor and the output terminal to output the power good signal, and a source and a body coupled to a system ground;
　a fourth transistor, having a gate and a drain coupled to a gate of the third transistor, the second terminal of the first resistor and the bias terminal; and
　a second resistor, having a first terminal coupled to a source of the fourth transistor, and a second terminal coupled to the system ground, wherein a size of the first transistor represents as (W1/L1), where W1 is a width of the first transistor and L1 is a length of the first transistor; a size of the second transistor represents as (W2/L2), where W2 is a width of the second transistor and L2 is a length of the second transistor; a size of the third transistor represents as (W3/L3), where W3 is a width of the third transistor and L3 is a length of the third transistor; a size of the fourth transistor represents as (W4/L4), where W4 is a width of the fourth transistor and L4 is a length of the fourth transistor; and $[(W3/L3)/(W1/L1)] < [(W4/L4)/(W2/L2)]$.

2. The power detection apparatus as claimed in claim 1, wherein the first current processing circuit is further configured to mirror a current of the bias terminal by a predetermined ratio to the output terminal.

3. The power detection apparatus as claimed in claim 1, wherein the first resistor is consist of a resistive element or a combination of series-connected diodes or transistors.

4. The power detection apparatus as claimed in claim 1, wherein:
　a relationship between current and bias voltage of the second current processing circuit in output terminal is corresponding to a first current-voltage (I-V) curve;
　a relationship between current and bias voltage of the first current processing circuit in output terminal which is mirrored by the first current processing circuit from its bias terminal is corresponding to a second I-V curve which is different from the first I-V curve; and
　the first I-V curve and the second I-V curve have an intersection point, and a voltage corresponding to the intersection point is the threshold voltage.

5. The power detection apparatus as claimed in claim 1, wherein a body of the fourth transistor is coupled to one of the first terminal of the second resistor and the system ground.

6. The power detection apparatus as claimed in claim 1, wherein when the dynamic bias voltage is greater than the threshold voltage, the current of the second current processing circuit output terminal is greater than that of the first current processing circuit output terminal.

7. The power detection apparatus as claimed in claim 1, wherein when the dynamic bias voltage is less than the threshold voltage, the current of the second current processing circuit output terminal is less than that of the first current processing circuit output terminal.

8. The power detection apparatus as claimed in claim 1, wherein:
　the threshold voltage varies with a resistance of the first resistor, and the threshold voltage is changed by setting the resistance of the first resistor;
　an operation current of the power detection apparatus varies with a resistance of the second resistor; and
　the first transistor and the second transistor are P-type transistors, and the third transistor and the fourth transistor are N-type transistors.

9. A power detection apparatus, comprising:
　a first current processing circuit, wherein the first current processing circuit is configured to provide a dynamic bias voltage at a bias terminal in response to a variation of a system power; and
　a second current processing circuit, coupled in cascade with the first current processing circuit and biased under the dynamic bias voltage, wherein the second current processing circuit is configured to output a power good signal at an output terminal to represent that the system power is ready when the dynamic bias voltage is greater than a threshold voltage, wherein the first current processing circuit comprises:
　a first transistor, having a source and a body both coupled to a system ground;
　a second transistor, having a source and a body both coupled to the system ground, and a gate and a drain both coupled to a gate of the first transistor; and
　a first resistor, having a first terminal coupled to the drain of the second transistor, and a second terminal coupled to the bias terminal to provide the dynamic bias voltage, wherein the second current processing circuit comprises:
　a third transistor, having a drain coupled to a drain of the first transistor and the output terminal to output the power good signal, and a source and a body coupled to the system power;
　a fourth transistor, having a gate and a drain coupled to a gate of the third transistor, the second terminal of the first resistor and the bias terminal; and
　a second resistor, having a first terminal coupled to a source of the fourth transistor, and a second terminal coupled to the system power, wherein a size of the first transistor represents as (W1/L1), where W1 is a width of the first transistor and L1 is a length of the first transistor; a size of the second transistor represents as (W2/L2), where W2 is a width of the second transistor and L2 is a length of the second transistor; a size of the third transistor represents as (W3/L3), where W3 is a width of the third transistor and L3 is a length of the third transistor; a size of the fourth transistor represents as (W4/L4), where W4 is a width of the fourth transistor and L4 is a length of the fourth transistor; and $[(W3/L3)/(W1/L1)] < [(W4/L4)/(W2/L2)]$.

10. The power detection apparatus as claimed in claim 9, wherein:
　a relationship between current and bias voltage of the second current processing circuit in output terminal is corresponding to a first current-voltage (I-V) curve;

a relationship between current and bias voltage of the first current processing circuit in output terminal which is mirrored by the first current processing circuit from its bias terminal is corresponding to a second I-V curve which is different from the first I-V curve; and the first I-V curve and the second I-V curve have an intersection point, and a voltage corresponding to the intersection point is the threshold voltage.

11. The power detection apparatus as claimed in claim 9, wherein the first resistor is consist of a resistive element or a combination of series-connected diodes or transistors, and a body of the fourth transistor is coupled to one of the first terminal of the second resistor and the system power.

12. The power detection apparatus as claimed in claim 9, wherein when the dynamic bias voltage is greater than the threshold voltage, the current of the second current processing circuit output terminal is greater than that of the first current processing circuit output terminal.

13. The power detection apparatus as claimed in claim 9, wherein when the dynamic bias voltage is less than the threshold voltage, the current of the second current processing circuit output terminal is less than that of the first current processing circuit output terminal.

14. The power detection apparatus as claimed in claim 9, wherein:

the threshold voltage varies with a resistance of the first resistor, and the threshold voltage is changed by setting the resistance of the first resistor;

an operation current of the power detection apparatus varies with a resistance of the second resistor; and the first transistor and the second transistor are N-type transistors, and the third transistor and the fourth transistor are P-type transistors.

* * * * *